United States Patent
Iwata et al.

(10) Patent No.: US 12,429,638 B2
(45) Date of Patent: Sep. 30, 2025

(54) METHOD FOR PRODUCING INFRARED LIGHT CUT FILTER, FILTER FOR SOLID-STATE IMAGING DEVICE, AND SOLID-STATE IMAGING DEVICE

(71) Applicant: TOPPAN Inc., Tokyo (JP)

(72) Inventors: Reiko Iwata, Taito-ku (JP); Yuri Nagai, Taito-ku (JP); Yasutake Akeno, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 639 days.

(21) Appl. No.: 17/847,723

(22) Filed: Jun. 23, 2022

(65) Prior Publication Data

US 2022/0317352 A1    Oct. 6, 2022

Related U.S. Application Data

(63) Continuation of application No. PCT/JP2020/048516, filed on Dec. 24, 2020.

(30) Foreign Application Priority Data

Dec. 24, 2019 (JP) .................................. 2019-233355

(51) Int. Cl.
*G02B 5/20* (2006.01)
*G02B 1/04* (2006.01)
(Continued)

(52) U.S. Cl.
CPC ............... *G02B 5/208* (2013.01); *G02B 1/04* (2013.01); *G02B 1/14* (2015.01); *G02B 5/22* (2013.01);
(Continued)

(58) Field of Classification Search
None
See application file for complete search history.

(56) References Cited

U.S. PATENT DOCUMENTS 9,917,134 B1    3/2018 Hsieh et al.
10,903,278 B2   1/2021 Kataoka et al.
(Continued)

FOREIGN PATENT DOCUMENTS

JP    2003-060176 A    2/2003
JP    2007-219114 A    8/2007
(Continued)

OTHER PUBLICATIONS

Japanese Office Action issued Dec. 26, 2023 in Japanese Patent Application No. 2019-233355 (with English translation), 8 pages.
(Continued)

*Primary Examiner* — Phu Vu
(74) *Attorney, Agent, or Firm* — Oblon, McClelland, Maier & Neustadt, L.L.P.

(57) ABSTRACT

A method for producing an infrared light cut filter, including forming an infrared light cut layer comprising an infrared light absorbing dye, forming a protective layer on the infrared light cut layer which provides protection against a stripping solution, forming a resist pattern on the protective layer, patterning the protective layer and the infrared light cut layer by dry etching based on the resist pattern, and removing the resist pattern from the protective layer by applying the stripping solution.

20 Claims, 3 Drawing Sheets

(51) Int. Cl.
*G02B 1/14* (2015.01)
*G02B 5/22* (2006.01)
*H10F 39/00* (2025.01)

(52) U.S. Cl.
CPC ....... *H10F 39/024* (2025.01); *H10F 39/8063* (2025.01)

(56) References Cited

U.S. PATENT DOCUMENTS

| | | |
|---|---|---|
| 2016/0320529 A1 | 11/2016 | Kashiwagi et al. |
| 2017/0166762 A1* | 6/2017 | Tomeba ................. G03F 7/168 |
| 2017/0317132 A1 | 11/2017 | Hatakeyama et al. |
| 2018/0076258 A1* | 3/2018 | Hsieh ................. H10F 39/8053 |
| 2019/0259815 A1 | 8/2019 | Kataoka et al. |
| 2020/0357836 A1 | 11/2020 | Miyata et al. |
| 2021/0118928 A1 | 4/2021 | Sayama |
| 2021/0143219 A1 | 5/2021 | Kataoka et al. |

FOREIGN PATENT DOCUMENTS

| | | | | |
|---|---|---|---|---|
| JP | 2011-186398 A | 9/2011 | | |
| JP | 2018-060910 A | 4/2018 | | |
| JP | 2018-150423 A | 9/2018 | | |
| JP | 2019180048 A | * 10/2019 | ......... | H01L 27/1462 |
| WO | WO 2016/117596 A1 | 7/2016 | | |
| WO | WO 2018/061781 A1 | 4/2018 | | |
| WO | WO 2019/176975 A1 | 9/2019 | | |

OTHER PUBLICATIONS

International Search Report issued Feb. 16, 2021 in PCT/JP2020/048516, filed Dec. 24, 2020, 5 pages (with English Translation).
Extended European Search Report issued Jan. 31, 2023 in European Patent Application No. 20906993.9, 7 pages.
Japanese Office Action issued Aug. 29, 2023 in Japanese Application 2019-233355, (with unedited computer-generated English Translation), 7 pages.
Korean Office Action issued Jul. 14, 2025 in Korean Patent Application No. 10-2022-7014416, 7 pages.

* cited by examiner

METHOD FOR PRODUCING INFRARED LIGHT CUT FILTER, FILTER FOR SOLID-STATE IMAGING DEVICE, AND SOLID-STATE IMAGING DEVICE

CROSS-REFERENCE TO RELATED APPLICATIONS

The present application is a continuation of International Application No. PCT/JP2020/048516, filed Dec. 24, 2020, which is based upon and claims the benefits of priority to Japanese Application No. 2019-233355, filed Dec. 24, 2019. The entire contents of all of the above applications are incorporated herein by reference.

BACKGROUND OF THE INVENTION

Field of the Invention

The present invention relates to a method of producing an infrared light cut filter, a filter for a solid-state imaging device, and a solid-state imaging device.

Discussion of the Background

Solid-state imaging devices such as CMOS image sensors and CCD image sensors include photoelectric conversion elements that convert intensity of incident light into an electrical signal. An example of a solid-state imaging device is a solid-state imaging device capable of detecting light corresponding to each of a plurality of colors. The solid-state imaging device includes a color filter for each color and a photoelectric conversion element for each color. The photoelectric conversion element for each color detects light for each color (see, for example, Patent Literature 1). Another example of the solid-state imaging device includes an organic photoelectric conversion element and an inorganic photoelectric conversion element, and light of each color is detected by each photoelectric conversion element, without using any color filter (see, for example, Patent Literature 2).

The solid-state imaging device includes an infrared light cut filter on a photoelectric conversion element. An infrared light absorbing dye of the infrared light cut filter absorbs infrared light, thereby cutting infrared light that can be detected by each photoelectric conversion element from entering the photoelectric conversion element. Thus, accuracy of detection of visible light by each photoelectric conversion element is enhanced. The infrared light cut filter contains, for example, a cyanine dye which is an infrared light absorbing dye (see, for example, PTL 3).

PTL 1: JP 2003-060176 A
PTL 2: JP 2018-060910 A
PTL 3: JP 2007-219114 A

SUMMARY OF THE INVENTION

According to an aspect of the present invention, a method for producing an infrared light cut filter includes forming an infrared light cut layer comprising an infrared light absorbing dye, forming a protective layer on the infrared light cut layer which provides protection against a stripping solution, forming a resist pattern on the protective layer, patterning the protective layer and the infrared light cut layer by dry etching based on the resist pattern, and removing the resist pattern from the protective layer by applying the stripping solution.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
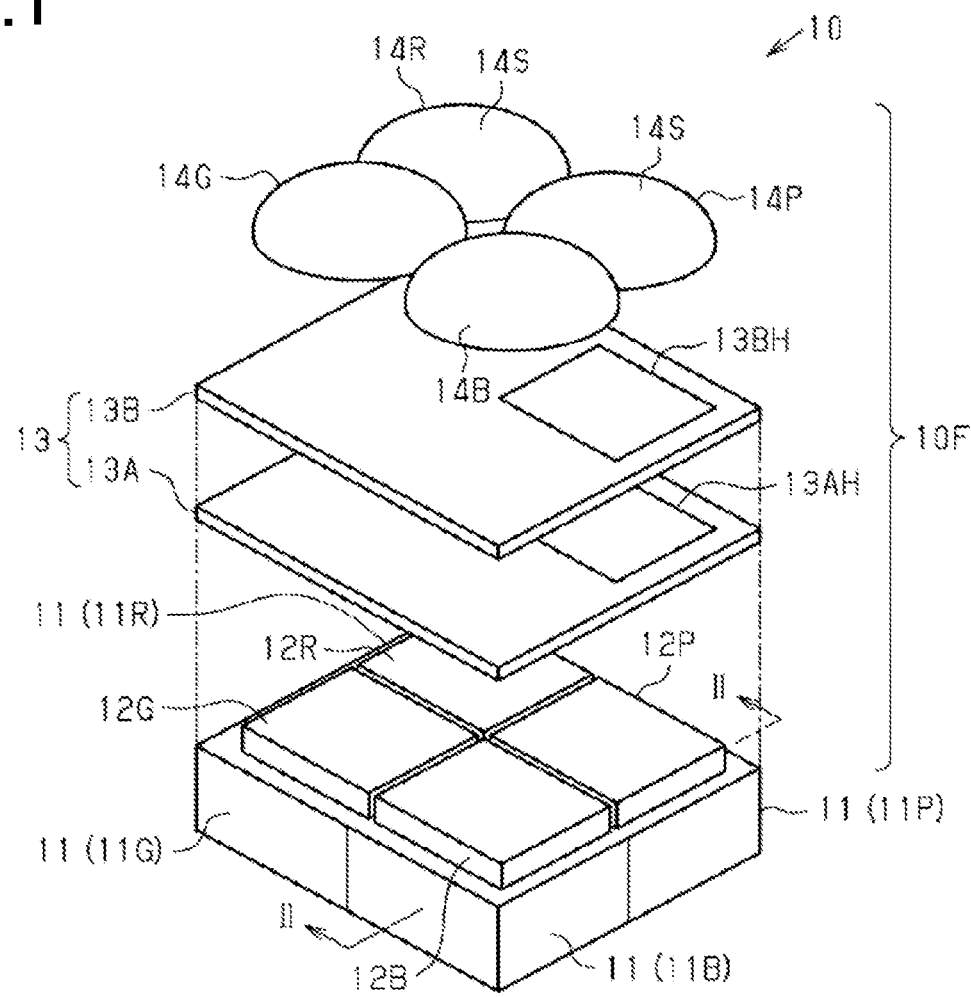
FIG. 1 is an exploded perspective view showing a structure of a solid-state imaging device according to one embodiment.

The embodiments will now be described with reference to the accompanying drawings, wherein like reference numerals designate corresponding or identical elements throughout the various drawings.

Embodiments of a method for producing an infrared light cut filter, a filter for a solid-state imaging device, and a solid-state imaging device will be described with reference to FIGS. 1 to 7. Hereinafter, the solid-state imaging device, the method for producing an infrared light cut filter, and Examples will be described in order. In the present embodiments, infrared light is light having a wavelength included in the range of 0.7 μm (700 nm) or more and 1 mm or less, and near infrared light is light having a wavelength included in the range of 700 nm or more and 1100 nm or less, especially, in the infrared light.

<Solid-State Imaging Device>

A solid-state imaging device will be described with reference to FIG. 1. FIG. 1 is a schematic configuration diagram showing each layer in a part of a solid-state imaging device in a separated manner.

As shown in FIG. 1, a solid-state imaging device 10 includes a filter 10F for a solid-state imaging device and a plurality of photoelectric conversion elements 11.

The plurality of photoelectric conversion elements 11 include a red photoelectric conversion element 11R, a green photoelectric conversion element 11G, a blue photoelectric conversion element 11B, and an infrared light photoelectric conversion element 11P. The red photoelectric conversion element 11R, the green photoelectric conversion element 11G, and the blue photoelectric conversion element 11B are examples of a first photoelectric conversion element. The infrared light photoelectric conversion element 11P is an example of a second photoelectric conversion element.

The solid-state imaging device 10 includes a plurality of the red photoelectric conversion elements 11R, a plurality of the green photoelectric conversion elements 11G, a plurality of the blue photoelectric conversion elements 11B, and a plurality of the infrared light photoelectric conversion elements 11P. Each infrared light photoelectric conversion element 11P measures intensity of infrared light. Note that FIG. 1 shows a repeating unit of the photoelectric conversion elements 11 in the solid-state imaging device 10 for convenience of illustration.

The filter 10F for a solid-state imaging device includes a plurality of visible light filters, an infrared light pass filter 12P, an infrared light cut filter 13, a plurality of visible light microlenses, and an infrared light microlens 14P.

The visible light color filters are composed of a red filter 12R, a green filter 12G, and a blue filter 12B. The red filter 12R is located on a side of the red photoelectric conversion element 11R on which light is incident. The green filter 12G is located on a side of the green photoelectric conversion element 11G on which light is incident. The blue filter 12B is located on a side of the blue photoelectric conversion element 11B on which light is incident.

The infrared light pass filter 12P is located on a side of the infrared light photoelectric conversion element 11P on which light is incident. The infrared light pass filter 12P cuts visible light that can be detected by the infrared light photoelectric conversion element 11P from entering the infrared light photoelectric conversion element 11P. That is, the infrared light pass filter 12P suppresses visible light which enters the filter 10F for a solid-state imaging device from being transmitted to the infrared light photoelectric conversion element 11P. Thus, accuracy of detection of infrared light by the infrared light photoelectric conversion element 11P is enhanced. The infrared light that can be detected by the infrared light photoelectric conversion element 11P is, for example, near-infrared light.

The infrared light cut filter 13 is located on a side of the filters 12R, 12G and 12B for each color on which light is incident. The infrared light cut filter 13 includes an infrared light cut layer 13A and a protective layer 13B. The protective layer 13B is laminated on the infrared light cut layer 13A and is located on the side of the infrared light cut layer 13A on which light is incident.

The infrared light cut layer 13A includes a through hole 13AH. The infrared light pass filter 12P is located in a region defined by the through hole 13AH when viewed from a viewpoint facing a plane on which the infrared light cut layer 13A extends. On the other hand, the infrared light cut layer 13A is located on the red filter 12R, the green filter 12G, and the blue filter 12B when viewed from the viewpoint facing the plane on which the infrared light cut layer 13A extends.

The infrared light cut layer 13A contains an infrared light absorbing dye. The infrared light absorbing dye has the maximum value for absorbance of infrared light at any wavelength included in near infrared light. Therefore, the infrared light cut layer 13A can reliably absorb near infrared light passing through the infrared light cut layer 13A. Thus, the near infrared light that can be detected by the photoelectric conversion element 11 for each color is sufficiently cut by the infrared light cut layer 13A.

The protective layer 13B includes a through hole 13BH. The through hole 13BH of the protective layer 13B overlaps with the through hole 13AH of the infrared light cut layer 13A when viewed from a direction facing a plane on which the protective layer 13B extends. A shape of an edge of the through hole 13BH of the protective layer 13B is equal to a shape of an edge of the through hole 13AH of the infrared light cut layer 13A. The infrared light pass filter 12P is located in a region defined by the through hole 13BH when viewed from the viewpoint facing the plane on which the protective layer 13B extends.

On the other hand, the protective layer 13B is located on the red filter 12R, the green filter 12G, and the blue filter 12B when viewed from the viewpoint facing the plane on which the protective layer 13B extends.

The protective layer 13B is preferably formed of a visible light filter and a transparent resin that does not affect spectral characteristics of the infrared light cut layer 13A. The protective layer 13B preferably has a transmittance of, for example, 90% or more for visible light and near infrared light.

A thickness of the protective layer 13B is preferably 1 nm or more and 200 nm or less. Since the protective layer 13B has a thickness of 1 nm or more, the reliability of suppressing the stripping solution from being permeated from a surface of the protective layer 13B to the infrared light cut layer 13A when forming the infrared light cut filter 13 is increased. When the protective layer 13B has a thickness of 200 nm or less, the thickness of the protective layer 13B is suppressed from affecting the spectral characteristics of the infrared light cut layer 13A.

The microlenses are composed of a red microlens 14R, a green microlens 14G, a blue microlens 14B, and an infrared light microlens 14P. The red microlens 14R is located closer to the light incident side than the red filter 12R. The green microlens 14G is located closer to the light incident side than the green filter 12G. The blue microlens 14B is located closer to the light incident side than the blue filter 12B. The infrared light microlens 14P is located closer to the light incident side than the infrared light pass filter 12P.

Each microlens 14R, 14G, 14B and 14P has a light incident surface 14S as an outer surface. Each of the microlenses 14R, 14G, 14B and 14P has a refractive index difference, relative to outside air, for focusing light that enters the light incident surface 14S toward the respective photoelectric conversion elements 11R, 11G, 11B and 11P. Each of the microlens 14R, 14G, 14B and 14P contains a transparent resin.

<Method for Producing Infrared Light Cut Filter>

A method for producing the infrared light cut filter 13 will be described with reference to FIGS. 2 to 7.

The method for producing the infrared light cut filter includes: forming an infrared light cut layer; forming a protective layer; forming a resist pattern; patterning the protective layer and the infrared light cut layer; and removing the resist pattern from the protective layer. The method for forming an infrared light cut layer includes forming an infrared light cut layer containing an infrared light absorbing dye. The method for forming a protective layer includes forming a protective layer provided on the infrared light cut layer for providing protection against a stripping solution. The method for forming a resist pattern includes forming a resist pattern on the protective layer. The method for patterning the protective layer and the infrared light cut layer includes patterning the protective layer and the infrared light cut layer by dry etching using the resist pattern. The method for removing the resist pattern from the protective layer includes removing the resist pattern from the protective layer using a stripping solution.

Hereinafter, the method for producing an infrared light cut filter will be described in more detail with reference to the drawings. Note that FIGS. 2 to 7 show only a structure corresponding to a cross section when a repeating unit of the solid-state imaging device 10 shown in FIG. 1 is cut along line for convenience of illustration.

Figure 2:
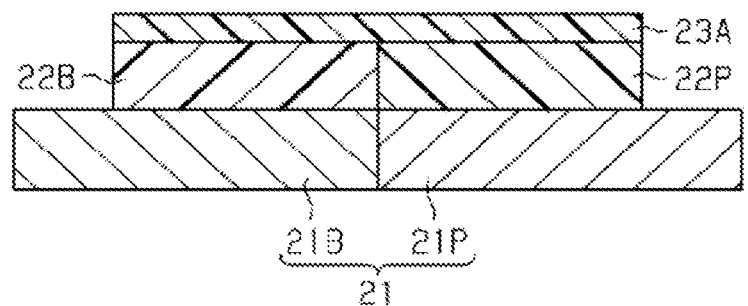
FIG. 2 is a process diagram for explaining a method for producing an infrared light cut filter.

As shown in FIG. 2, when an infrared light cut filter is produced, first, a semiconductor substrate 21 on which a plurality of photoelectric conversion elements are formed is prepared. The plurality of photoelectric conversion elements are two-dimensionally arranged on the semiconductor substrate 21. The semiconductor substrate 21 includes a blue photoelectric conversion element 21B corresponding to the above-mentioned blue filter 12B and an infrared light photoelectric conversion element 21P corresponding to the infrared light pass filter 12P. A material for forming the semiconductor substrate 21 may include, for example, Si, a silicon oxide such as $SiO_2$, a silicon nitride such as SiN, or a mixture thereof.

Next, a filter for each color corresponding to each photoelectric conversion element of the semiconductor substrate 21 and an infrared light pass filter are formed. As a result, a blue filter 22B is formed on the blue photoelectric conversion element 21B, and an infrared light pass filter 22P is formed on the infrared light photoelectric conversion element 21P.

The filter for each color is formed by forming a coating film containing a pigment and a photosensitive resin, and patterning the coating film using photolithography. As the pigment for forming the filter for each color, an organic pigment or an inorganic pigment can be used alone, or two or more kinds thereof can be used in combination. The pigment preferably has high color development and high heat resistance, particularly has high thermal decomposition resistance, and is preferably an organic pigment. Examples of the organic pigment include phthalocyanine-based pigments, azo-based pigments, anthraquinone-based pigments, quinacridone-based pigments, dioxazine-based pigments, anthanthrone-based pigments, indanthrone-based pigments, perylene-based pigments, thioindigo-based pigments, isoindoline-based pigments, quinophthalone-based pigments, and diketopyrrolopyrrole-based pigments.

The infrared light pass filter is formed by forming a coating film containing a black dye or a black dyestuff and a photosensitive resin, and patterning the coating film using a photographic method. The material for forming the infrared light pass filter 22P contains a black dye or a black dyestuff, and a photosensitive composition. The black dye is a single dye having a black color, or a mixture of two or more dyes having a black color. The black dyestuff may be, for example, an azo-based dyestuff, an anthraquinone-based dyestuff, an azine-based dyestuff, a quinoline-based dyestuff, a perinone-based dyestuff, a perylene-based dyestuff, or a methine-based dyestuff. The photosensitive composition includes, for example, a binder resin, a photopolymerization initiator, a polymerizable monomer, an organic solvent, and a leveling agent.

The material for forming the infrared light pass filter 22P can contain particles of an inorganic oxide for adjusting the refractive index. The inorganic oxide is, for example, aluminum oxide, silicon oxide, zirconium oxide, or titanium oxide. The infrared light pass filter 22P can contain additives for allowing the infrared light pass filter to also have other functions different from the function of cutting visible light, such as a light stabilizer, an antioxidant, a heat stabilizer, and an antistatic agent.

The infrared light cut layer 23A containing an infrared light absorbing dye is then formed. When the infrared light cut layer 23A is formed, first, a coating liquid containing an infrared light absorbing dye, a transparent resin, and an organic solvent is applied onto the filter for each color and onto the infrared light pass filter, and then the coating film is dried. The dried coating film is then cured by heating. As a result, the infrared light cut layer 23A is formed on the filter for each color and on the infrared light pass filter.

A material for forming the infrared light cut layer 23A contains a transparent resin and an infrared light absorbing dye. The transparent resin may be, for example, an acrylic resin, a polyamide resin, a polyimide resin, a polyurethane resin, a polyester resin, a polyether resin, a polyolefin resin, a polycarbonate resin, a polystyrene resin, or a norbornene resin. Of these resins, the transparent resin is preferably an acrylic resin.

The infrared light absorbing dye may be, for example, an anthraquinone-based dye, a cyanine-based dye, a phthalocyanine-based dye, a dithiol-based dye, a diimonium-based dye, a squarylium-based dye, or a croconium-based dye. Of these dyes, the infrared light absorbing dye is preferably a cyanine-based dye or a phthalocyanine-based dye.

Figure 3:
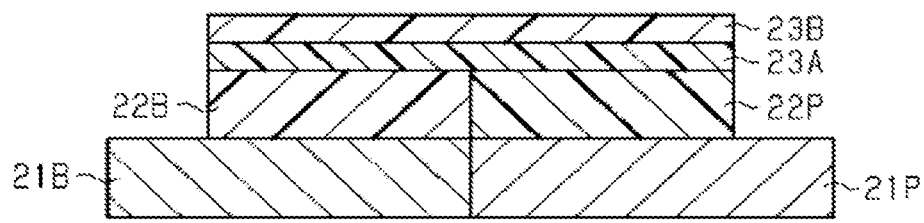
FIG. 3 is a process diagram for explaining the method for producing the infrared light cut filter.

As shown in FIG. 3, the protective layer 23B is formed on the infrared light cut layer 23A. When the protective layer 23B is formed, first, a coating liquid containing a transparent resin is applied onto the infrared light cut layer 23A, and then the coating film is dried. The dried coating film is then cured by heating. As a result, the protective layer 23B is formed.

A material for forming the protective layer 23B contains a transparent resin. The transparent resin may be, for example, an acrylic resin, a polyamide resin, a polyimide resin, a polyurethane resin, a polyester resin, a polyether resin, a polyolefin resin, a polycarbonate resin, a polystyrene resin, or a norbornene resin.

The material for forming the protective layer 23B preferably contains a resin having a crosslinked structure in which an epoxy group and a functional group reacting with the epoxy group are crosslinked. Since the resin forming the protective layer 23B is a resin having a crosslinked structure, resistance of the protective layer 23B to the stripping solution is enhanced.

Functional groups reacting with an epoxy group include, for example, hydroxyl groups, phenolic hydroxyl groups, organic acids, acid anhydrides, and amino groups. These functional groups easily react with an epoxy group during formation of the coating film, and form a crosslinked structure therewith, so that the resistance of the protective layer 23B to the stripping solution is enhanced. In particular, the material for forming the protective layer 23B is more preferably a resin having a crosslinked structure in which a phenolic hydroxyl group ($—C_6H_4OH$) and an epoxy group are crosslinked. Since the resin has a crosslinked structure formed by a phenolic hydroxyl group and an epoxy group, the resistance of the protective layer 23B to the stripping solution is further enhanced. The phenolic hydroxyl group is weakly acidic, and thus only weakly crosslinks with an epoxy group in a resin polymerization process, and instead a crosslinking reaction occurs in a heating process at the time of forming the coating film, which is advantageous in terms of ease of coating.

Further, the protective layer 23B is preferably formed from an acrylic resin. It is preferable to use 4-hydroxyphenyl methacrylate and glycidyl methacrylate as monomers constituting the acrylic resin. That is, the protective layer 23B is preferably made of an acrylic resin formed from monomers including at least 4-hydroxyphenyl methacrylate and glycidyl methacrylate.

In addition to 4-hydroxyphenyl methacrylate and glycidyl methacrylate, a monomer copolymerizable with 4-hydroxyphenyl methacrylate and glycidyl methacrylate can be used as a monomer constituting the acrylic resin that forms the protective layer 23B. The copolymerizable monomer may be, for example, a styrene-based monomer, a (meth)acrylic monomer, a vinyl ester-based monomer, a vinyl ether-based monomer, a halogen element-containing vinyl-based monomer, a diene-based monomer, or a maleimide-based monomer. The styrene-based monomer may be, for example, styrene, α-methylstyrene, p-methylstyrene, m-methyl styrene, p-methoxy styrene, p-hydroxystyrene, p-acetoxystyrene, vinyltoluene, ethyl styrene, phenylstyrene, or benzylstyrene. The (meth)acrylic monomer may be, for example, methyl acrylate, ethyl acrylate, butyl acrylate, 2-ethylhexyl acrylate, methyl methacrylate, ethyl methacrylate, butyl methacrylate, 2-ethylhexyl methacrylate, cyclohexyl methacrylate, or dicyclopentanyl methacrylate. The vinyl ester-based monomer may be, for example, vinyl acetate. The vinyl ether-based monomer may be, for example, vinyl methyl ether. The halogen element-containing vinyl-based monomer may be, for example, vinyl chloride. The diene-based monomer may be, for example, butadiene and isobutylene. The maleimide-based monomer may be, for example, cyclohexylmaleimide or phenylmaleimide. The acrylic resin may be formed from two or more kinds of the above-described monomers.

The monomer copolymerized with 4-hydroxyphenyl methacrylate and glycidyl methacrylate, i.e., monomer copolymerizable with one or both of 4-hydroxyphenyl methacrylate and glycidyl methacrylate is particularly preferably an acrylic monomer containing an aromatic ring. The acrylic monomer containing an aromatic ring may be, for example, benzyl (meth)acrylate, phenyl (meth)acrylate, phenoxyethyl (meth)acrylate, phenoxypolyethylene glycol (meth)acrylate, nonylphenoxypolyethylene glycol (meth)acrylate, phenoxypolypropylene glycol (meth)acrylate, 2-(meth)acryloyloxyethyl-2-hydroxypropyl phthalate, 2-hydroxy-3-phenoxypropyl (meth)acrylate, 2-(meth)acryloyloxyethyl hydrogen phthalate, 2-(meth)acryloyloxypropyl hydrogen phthalate, ethoxylated ortho-phenyl phenol (meth)acrylate, o-phenylphenoxyethyl (meth)acrylate, 3-phenoxybenzyl (meth)acrylate, 4-hydroxyphenyl (meth)acrylate, 2-naphthol (meth)acrylate, 4-biphenyl (meth)acrylate, 9-anthrylmethyl (meth)acrylate, 2-[3-(2H-benzotriazol-2-yl)-4-hydroxyphenyl]ethyl (meth)acrylate, phenolethylene oxide (EO) modified acrylate, nonylphenol (EO) modified acrylate, 2-(meth)acryloyloxyethyl phthalate, or 2-(meth)acryloyloxyethyl hexahydrophthalate. The acrylic monomer containing an aromatic ring is particularly preferably phenyl methacrylate.

Figure 4:
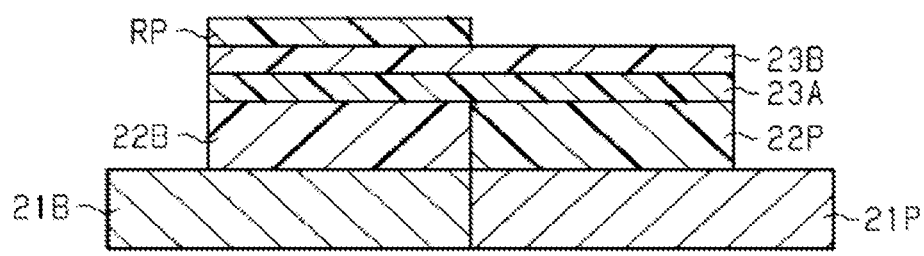
FIG. 4 is a process diagram for explaining the method for producing the infrared light cut filter.

As shown in FIG. 4, a resist pattern RP is formed on a portion of the protective layer 23B, which is located on the filter for each color. When the resist pattern RP is formed, first, a photoresist layer is formed so as to cover the entire protective layer 23B. A positive resist or a negative resist may be used as a material for forming the photoresist layer.

A part of the photoresist layer is exposed to light using a photomask. At this time, when the photoresist layer is formed from a positive resist, only a portion of the photoresist layer which covers the infrared light pass filter 22P is exposed to light. On the other hand, when the photoresist layer is formed from a negative resist, only a portion of the photoresist layer which covers the filter for each color, is exposed to light.

Then, the photoresist layer is developed. Thus, the resist pattern RP having an opening, which overlaps with the infrared optical pass filter 22P, is formed when viewed from a viewpoint facing a plane on which the protective layer 23B extends.

Figure 5:
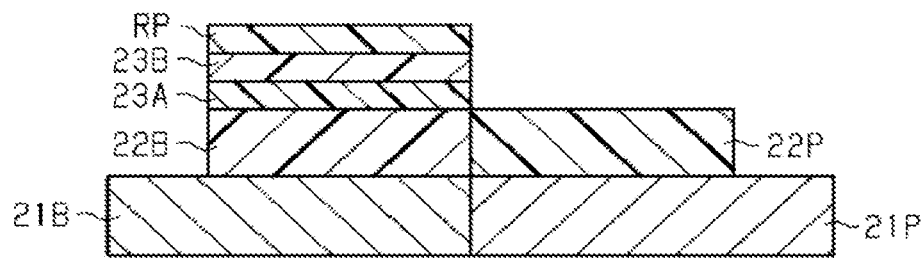
FIG. 5 is a process diagram for explaining the method for producing the infrared light cut filter.

As shown in FIG. 5, the protective layer 23B and the infrared light cut layer 23A are patterned by dry etching using the resist pattern RP. Thus, a portion of a laminate of the protective layer 23B and the infrared light cut layer 23A, which covers the infrared light pass filter 22P, is removed from the respective layers 23A and 23B, when viewed from the viewpoint facing the plane on which the protective layer 23B extends.

The dry etching may be, for example, plasma etching. In the dry etching, a reactive gas and a noble gas, i.e., a gas composed of a Group 18 element, can be used as etching gases. In the dry etching of the infrared light cut layer 23A and the protective layer 23B, a bias can be applied to targets for etching including these layers 23A and 23B. This enables anisotropic etching using the resist pattern RP.

Figure 6:
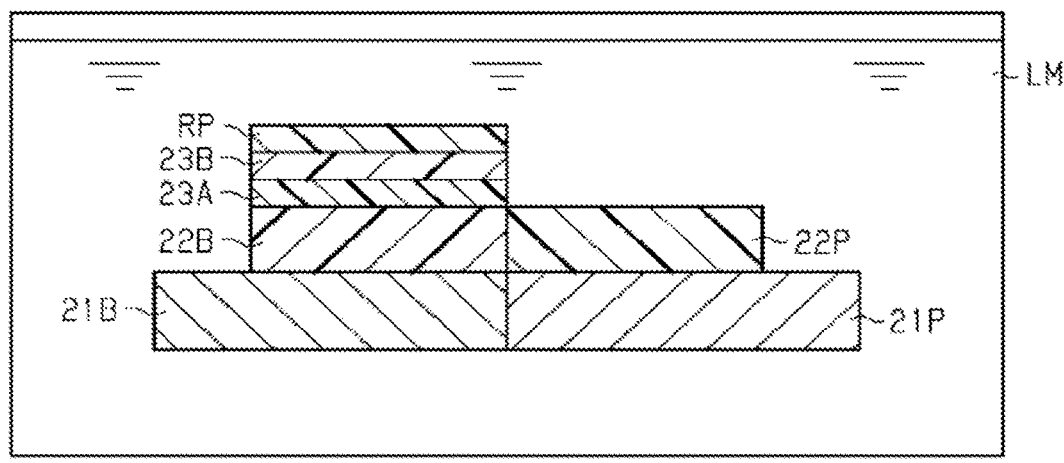
FIG. 6 is a process diagram for explaining the method for producing the infrared light cut filter.

As shown in FIG. 6, the resist pattern RP is removed from the protective layer 23B using a stripping solution LM. As the stripping solution LM, a liquid capable of dissolving the resist pattern RP can be used. The stripping solution LM may be, for example, N-methylpyrrolidone or dimethyl sulfoxide. When the stripping solution LM is N-methylpyrrolidone or dimethyl sulfoxide, it is possible to meet all requirements for resistance to the stripping solution LM, heat resistance, and spectral characteristics of the infrared light cut filter, due to the fact that the protective layer 23B is formed from the acrylic resin having the crosslinked structure described above.

In the production method of the present embodiment, when the infrared light cut layer 23A comes into contact with the stripping solution LM, the infrared light cut layer 23A is covered with the protective layer 23B that does not contain an infrared light absorbing dye. Therefore, an area of the infrared light cut layer 23A in contact with the stripping solution LM is smaller than that in the case where the infrared light cut layer 23A is not covered by the protective layer 23B. Therefore, an amount of the stripping solution LM permeated into the infrared light cut layer 23A can be reduced. As a result, it is possible to reduce an amount of the infrared light absorbing dye eluted from the infrared light cutting layer 23A. Further, although the protective layer 23B is in contact with the stripping solution LM, the protective layer 23B does not contain an infrared light absorbing dye, and thus the spectral characteristics of the protective layer 23B can be suppressed from affecting the spectral characteristics of the infrared light cut filter.

In FIG. 6, dipping is exemplified as a method for contacting the protective layer 23B and the stripping solution LM, but the method for contacting the protective layer 23B and the stripping solution LM may be a spray type method or a spin type method.

Figure 7:
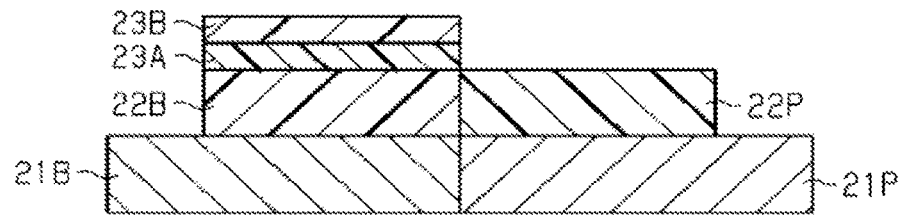
FIG. 7 is a process diagram for explaining the method for producing the infrared light cut filter.

As shown in FIG. 7, the resist pattern RP is removed from the protective layer 23B. This makes it possible to form an infrared light cut filter provided with the protective layer 23B and the infrared light cut layer 23A. Of the infrared light cut layer 23A and the protective layer 23B formed by the production method described above, a portion corresponding to the repeating unit of the photoelectric conversion element 11 is the infrared light cut filter 13 including the infrared light cut layer 13A and the protective layer 13B.

It is possible to produce a solid-state imaging device by forming a plurality of microlenses on the infrared light cut filter produced by the above-described method. The plurality of microlenses are formed, for example, by forming a coating film containing a transparent resin, patterning the coating film using photolithography, and reflowing by heat treatment.

EXAMPLES

Examples and a Comparative Example of the infrared light cut filter will be described with reference to Table 1.

Example 1

An infrared light cut layer containing a cyanine dye as an infrared light absorbing dye, and an acrylic resin, was formed on a glass substrate, and a protective layer having a thickness of 50 nm was formed on the infrared light cut layer.

An acrylic resin obtained by copolymerizing phenyl methacrylate, 4-hydroxyphenyl methacrylate, and glycidyl methacrylate was used to form the protective layer. When the acrylic resin was formed by copolymerization, an amount of phenyl methacrylate was set to 50 mass %, an amount of 4-hydroxyphenyl methacrylate was set to 25 mass %, and an amount of glycidyl methacrylate was set to 25 mass %, in a case where the total sum of the above-described monomers was 100 mass %. As a result, an infrared light cut filter of Example 1 was obtained.

Example 2

An infrared light cut filter of Example 2 was obtained by the method similar to that of Example 1, except that the amount of phenyl methacrylate used in Example 1 was changed to 65 mass %, the amount of 4-hydroxyphenyl methacrylate used therein was changed to 30 mass %, and the amount of glycidyl methacrylate used therein was changed to 5 mass %.

Comparative Example 1

An infrared light cut filter of Comparative Example 1 was obtained by the method similar to that of Example 1, except that no protective layer was formed.
<Evaluation Method>
<Spectral Characteristics>

A spectrophotometer (U-4100, produced by Hitachi High-Tech Corporation) was used to measure the transmittance of the infrared light cut filter for light having a wavelength of 350 nm to 1150 nm. As a result, the transmittance spectrum was obtained for each infrared light cut filter. The transmittance spectrum was obtained for each infrared light cut filter before and after a peel resistance test and a heat resistance test described below. It was found, from the transmittance spectrum, that, before and after each test, the maximum absorption wavelength in each infrared light cut filter was 950 nm.
<Stripping Solution Resistance>

Each infrared light cut filter was immersed in the stripping solution for 1 minute. The transmittance of the infrared light cut filter after immersion was measured, and a difference of the transmittance of the infrared light cut filter after immersion relative to the transmittance of the infrared light cut filter before immersion, at 950 nm, was calculated.
<Heat Resistance>

After a stripping solution resistance test was performed, each infrared light cut filter was heated on a hot plate at 250° C. for 10 minutes. The transmittance of the infrared light cut filter after heating was measured, and a difference of the transmittance of the infrared light cut filter after heating relative to the transmittance of the infrared light cut filter before heating, at 950 nm, was calculated.
<Evaluation Result>

TABLE 1

| | Difference in transmittance (%) | |
|---|---|---|
| | Peel resistance test | Heat resistance test |
| Example 1 | 0.6 | 13 |
| Example 2 | 0.03 | 12 |
| Comparative Example 1 | 10 | 13 |

It was found that, after the stripping solution resistance test, the difference in transmittance in the infrared light cut filter of Example 1 was 0.6%, and the difference in transmittance in the infrared light cut filter of Example 2 was 0.03%, as shown in Table 1. Hence, it was found that, in the infrared light cut filters of Example 1 and Example 2, the difference in transmittance was 1% or less after the stripping solution resistance test. On the other hand, it was found that, after the stripping solution resistance test, the difference in transmittance in the infrared light cut filter of Comparative Example 1 was 10%. Further, it was found that the difference in the infrared light cut filter of Comparative Example 1 was 10 times or more larger than the differences in the infrared light cut filters of Examples 1 and 2. Hence, it was found that the infrared light cut filter provided with the protective layer covering the infrared light cut layer, after the treatment with the stripping solution, had a suppressed change in the transmittance of the infrared light cut filter.

Also, it was found that, after the heat resistance test, the difference in transmittance in the infrared light cut filter of Example 1 was 13%, and the difference in transmittance in the infrared light cut filter of Example 2 was 12%. On the other hand, it was found that, after the heat resistance test, the difference in transmittance in the infrared light cut filter of Comparative Example 1 was 13%.

As described above, the differences in transmittance between before and after the heat resistance test in Example 1, Example 2 and Comparative Example 1 were all substantially the same. That is, it can be said that the infrared light cut filters of Examples 1 and 2, and the infrared light cut filter of Comparative Example 1 have substantially the same level of heat resistance. From the above results, it was found that the addition of the protective film to the infrared light cut filter did not affect the heat resistance of the infrared light cut filter, and that the infrared light cut filters of Examples 1 and 2 had both the resistance to the stripping solution and the resistance to heat.

As described above, the embodiments of the method for producing an infrared light cut filter, the filter for a solid-state imaging device, and the solid-state imaging device can provide the effects described below.

(1) The protective layer 23B suppresses the infrared light cut layer 23A from coming into contact with the stripping solution LM, and thus the stripping solution is suppressed from being permeated into the infrared light cut layer 23A. This suppresses the elution of the infrared light absorbing dye from the infrared light cut layer 23A, and as a result, deterioration of spectral characteristics of the infrared light cut filter 13 is suppressed.

(2) Since the resin forming the protective layer 23B has a crosslinked structure, the elution of the infrared light absorbing dye from the infrared light cutting layer 23A is further suppressed.

(3) Since the resin forming the protective layer 23B is an acrylic resin having a crosslinked structure, the elution of the infrared light absorbing dye from the infrared light cutting layer 23A is further suppressed.

(4) By forming the protective layer 23B using an acrylic resin composed of 4-hydroxyphenyl methacrylate and glycidyl methacrylate, the elution of the infrared light absorbing dye from the infrared light blocking layer 23A can be further suppressed.

(5) Since proportions of the respective monomers for forming the acrylic resin fall within the above-described ranges, the elution of the infrared light absorbing dye from the infrared light cut layer 23A is further suppressed, and the heat resistance of the infrared light cut filter including the protective layer 23B is maintained.

(6) Since the stripping solution LM is N-methylpyrrolidone or dimethyl sulfoxide, the protective layer 23B can suppress the elution of the infrared light absorbing dye into the stripping liquid LM.

<Modification>

The above-described embodiments can be modified and implemented as follows.

<Protective Layer>

In the protective layer 13B, the percent by mass of each monomer when an acrylic resin is formed using phenyl methacrylate, 4-hydroxyphenyl methacrylate, and glycidyl methacrylate can be appropriately changed. Further, the protective layer 13B does not have to be made of an acrylic resin formed using phenyl methacrylate, 4-hydroxyphenyl methacrylate, and glycidyl methacrylate. Even in this case, the infrared light cut filter 13 includes the protective layer 13B that covers the infrared light cut layer 13A, and thus the effect according to the above item (1) can be obtained.

The protective layer 13B does not have to be formed of a resin having a crosslinked structure in which a phenolic hydroxyl group and an epoxy group are crosslinked, and also does not have to be formed of a resin having a crosslinked structure in which an epoxy group and a functional group that reacts with the epoxy group are crosslinked. Even in this case, the infrared light cut filter 13 includes the protective layer 13B that covers the infrared light cut layer 13A, and thus the effect according to the above item (1) can be obtained.

The material for forming the protective layer 13B may be the same as the material for forming each microlens, or they may be different from each other.

<Stripping Solution>

The stripping solution LM may be a liquid other than N-methylpyrrolidone and dimethyl sulfoxide as long as it is a liquid capable of dissolving the material forming the resist pattern RP.

<Barrier Layer>

The filter 10F for a solid-state imaging device may include a barrier layer located between the infrared light cut filter 13 and each microlens. The barrier layer suppresses an oxidation source from reaching the infrared light cut filter 13. The oxidation source includes, for example, oxygen and water. The barrier layer can also be arranged on an outer surface of each microlens.

When the filter 10F for a solid-state imaging device includes a barrier layer, the solid-state imaging device 10 may include an anchor layer between the barrier layer and a lower layer of the barrier layer. In this case, adhesion between the barrier layer and the lower layer of the barrier layer is enhanced by the anchor layer. Further, the solid-state imaging device 10 may include an anchor layer between the barrier layer and an upper layer of the barrier layer. In this case, adhesion between the barrier layer and the upper layer of the barrier layer is enhanced by the anchor layer. A material for forming the anchor layer is, for example, a polyfunctional acrylic resin, or a silane coupling agent.

<Color Filter>

The color filters may be three color filters composed of a cyan filter, a yellow filter, and a magenta filter. Further, the color filters may be four color filters composed of a cyan filter, a yellow filter, a magenta filter, and a black filter. Further, the color filters may be four color filters composed of a transparent filter, a yellow filter, a red filter, and a black filter.

<Others>

The filters 12R, 12G and 12B for each color may have a thickness equal to that of the infrared light pass filter 12P, or they may have different thicknesses therefrom. The thicknesses of the filters 12R, 12G and 12B for each color may be, for example, 0.5 μm or more and 5 μm or less.

The material for forming the infrared light cut filter 13 can contain additives for allowing the infrared light cut filter to also have other functions different from the function of cutting infrared light, such as a light stabilizer, an antioxidant, a heat stabilizer, and an antistatic agent.

The solid-state imaging device 10 may be configured such that an oxygen transmission rate in a laminated structure located on a light incident surface 14S side with respect to the infrared light cut filter 13 is 5.0 cc/m$^2$/day/atm or less. For example, the laminated structure may be another functional layer such as a flattening layer or an adhesion layer, and an oxygen transmission rate thereof may be 5.0 cc/m$^2$/day/atm or less, together with each microlens.

The solid-state imaging device 10 may include a bandpass filter on the side of the plurality of microlenses on which light is incident. The bandpass filter is a filter that transmits only light having specific wavelengths of visible light and near infrared light, and has a function similar to that of the infrared light cut filter 13. That is, the bandpass filter can cut unnecessary infrared light that can be detected by the photoelectric conversion elements 11R, 11G and 11B for each color. Thus, it is possible to enhance the accuracy of detection of visible light by the photoelectric conversion elements 11R, 11G and 11B for each color and the accuracy of detection of near infrared light having a wavelength of an 850 nm or 940 nm band, which is a target for detection by the infrared light photoelectric conversion element 11P.

The present application addresses the following. Along with miniaturization of the pixel size in the solid-state imaging device, miniaturization of the infrared light cut filter is required. The miniaturization of the infrared light cut filter is realized by dry etching using a resist pattern formed on the infrared light cut filter. In patterning of an infrared light cut filter using dry etching, first, a resist pattern is formed on the infrared light cut filter. Next, the infrared light cut filter is etched using the resist pattern, and then the resist pattern is removed from the infrared light cut filter. When a stripping solution used to remove the resist pattern from the infrared light cut filter comes into contact with the infrared light cut filter, some infrared light absorbing dye contained in the infrared light cut filter is eluted out of the infrared light cut filter. This deteriorates spectral characteristics of the infrared light cut filter.

An aspect of the present invention is to provide a method for producing an infrared light cut filter which is capable of suppressing deterioration of spectral characteristics of an infrared light cut filter, a filter for a solid-state imaging device, and a solid-state imaging device.

A method for producing an infrared light cut filter for solving the above problem includes: forming an infrared light cut layer containing an infrared light absorbing dye; forming a protective layer on the infrared light cut layer for providing protection against a stripping solution; forming a resist pattern on the protective layer; patterning the protective layer and the infrared light cut layer by dry etching using the resist pattern; and removing the resist pattern from the protective layer using the stripping solution.

A filter for a solid-state imaging device for solving the above problem includes: three color filters which are a red filter, a green filter and a blue filter, which are located on a side of a first photoelectric conversion element on which light is incident; an infrared light pass filter located on a side of a second photoelectric conversion element on which light is incident; and an infrared light cut filter located on the respective side of the color filters on which light is incident. The infrared light cut filter includes an infrared light cut layer and a protective layer which is laminated on the infrared light cut layer and located on the side of the infrared light cut layer on which light is incident.

A solid-state imaging device, to solve the above problem includes: a first photoelectric conversion element; a second photoelectric conversion element; and the filter for a solid-state imaging device described above.

According to each of the above configurations, the protective layer suppresses the infrared light cut layer from coming into contact with the stripping solution, and thus the stripping solution is suppressed from being permeated into the infrared light cut layer. This suppresses elution of the infrared light absorbing dye from the infrared light cut layer, and, as a result, deterioration of spectral characteristics of the infrared light cut filter is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing an infrared light cut filter, comprising:
    forming, on a plurality of color filters, an infrared light cut layer comprising an infrared light absorbing dye;
    forming a protective layer on the infrared light cut layer which provides protection against a stripping solution;
    forming a resist pattern on the protective layer such that the resist pattern has an opening overlapping with an infrared optical pass filter in the color filters;
    patterning the protective layer and the infrared light cut layer by dry etching based on the resist pattern such that a portion of a laminate comprising the protective layer and the infrared light cut layer, which is covering the infrared optical pass filter in the color filters, is removed; and
    applying the stripping solution to the resist pattern formed on the protective layer such that the resist pattern is removed from the protective layer.

2. The method according to claim 1, wherein the forming of the protective layer comprises forming the protective layer from a resin having a crosslinked structure in which an epoxy group and a functional group that reacts with the epoxy group are crosslinked.

3. The method according to claim 2, wherein the functional group is a phenolic hydroxyl group.

4. The method according to claim 3, wherein the forming of the protective layer comprises forming the protective layer from an acrylic resin produced from monomers including 4-hydroxyphenyl methacrylate and glycidyl methacrylate.

5. The method according to claim 4, wherein the forming of the protective layer comprises producing the acrylic resin from 20 mass % or more of 4-hydroxyphenyl methacrylate and 5 mass % or more of glycidyl methacrylate with respect to 100 mass % of acrylic monomers used in producing the acrylic resin.

6. The method according to claim 5, wherein the producing of the acrylic resin includes using 4-hydroxyphenyl methacrylate, glycidyl methacrylate, and a monomer copolymerizable with at least one of 4-hydroxyphenyl methacrylate and glycidyl methacrylate.

7. The method according to claim 6, wherein the copolymerizable monomer is an acrylic monomer including an aromatic ring.

8. The method according to claim 7, wherein the removing of the resist pattern comprises applying N-methylpyrrolidone or dimethyl sulfoxide as the stripping solution.

9. A filter, comprising:
    a plurality of color filters positioned on a light incident side of a first photoelectric conversion element;
    an infrared light pass filter positioned on a light incident side of a second photoelectric conversion element; and
    an infrared light cut filter positioned on a respective light incident side of the color filters,
    wherein the infrared light cut filter includes an infrared light cut layer, and a protective layer laminated on the infrared light cut layer and positioned on a light incident side of the infrared light cut layer, the plurality of color filters includes a red filter, a green filter, a blue filter, and an infrared optical pass filter, and the infrared light cut filter is formed such that a laminate comprising the infrared light cut layer and the protective layer is covering the red filter, the green filter and the blue filter and has a portion covering the infrared optical pass filter removed.

10. A solid-state imaging device, comprising:
    a first photoelectric conversion element;
    a second photoelectric conversion element; and
    the filter of claim 9.

11. The method according to claim 1, wherein the removing of the resist pattern comprises applying N-methylpyrrolidone or dimethyl sulfoxide as the stripping solution.

12. The method according to claim 2, wherein the removing of the resist pattern comprises applying N-methylpyrrolidone or dimethyl sulfoxide as the stripping solution.

13. The method according to claim 3, wherein the removing of the resist pattern comprises applying N-methylpyrrolidone or dimethyl sulfoxide as the stripping solution.

14. The filter according to claim 9, wherein the protective layer comprises a resin having a crosslinked structure in which an epoxy group and a functional group that reacts with the epoxy group are crosslinked.

15. The filter according to claim 14, wherein the functional group is a phenolic hydroxyl group.

16. The filter according to claim 15, wherein the protective layer comprises an acrylic resin produced from monomers including 4-hydroxyphenyl methacrylate and glycidyl methacrylate.

17. The filter according to claim 16, wherein the protective layer comprises the acrylic resin from 20 mass % or more of 4-hydroxyphenyl methacrylate and 5 mass % or more of glycidyl methacrylate with respect to 100 mass % of acrylic monomers used in producing the acrylic resin.

18. The filter according to claim 17, wherein the acrylic resin is obtained by a process comprising polymerizing 4-hydroxyphenyl methacrylate, glycidyl methacrylate, and a monomer copolymerizable with at least one of 4-hydroxyphenyl methacrylate and glycidyl methacrylate.

19. The filter according to claim 18, wherein the copolymerizable monomer is an acrylic monomer including an aromatic ring.

20. A solid-state imaging device, comprising:
   a first photoelectric conversion element;
   a second photoelectric conversion element; and
   the filter of claim 14.

\* \* \* \* \*